United States Patent [19]
Kobayashi et al.

[11] Patent Number: 5,557,145
[45] Date of Patent: Sep. 17, 1996

[54] MOUNTING CONSTRUCTION AND METHOD OF A SEMICONDUCTOR DEVICE BY WHICH DEFORMATION OF LEADS IS PREVENTED

[75] Inventors: Hitoshi Kobayashi; Yuichi Asano; Kenji Kobayashi; Kenichi Sasaki; Yuji Sakurai, all of Murata-machi, Japan

[73] Assignee: Fujitsu Limited, Kawasaki, Japan

[21] Appl. No.: 401,441

[22] Filed: Mar. 9, 1995

[30] Foreign Application Priority Data

Mar. 11, 1994 [JP] Japan .................. 6-041497

[51] Int. Cl.⁶ .................. H01L 23/48; H01L 23/52
[52] U.S. Cl. .................. 257/692; 257/666; 257/696
[58] Field of Search .................. 257/688, 666, 257/674, 696, 692, 787

[56] References Cited

U.S. PATENT DOCUMENTS

| | | | |
|---|---|---|---|
| 5,105,261 | 4/1992 | Ueda et al. | 257/787 |
| 5,185,653 | 2/1993 | Switky et al. | 257/666 |
| 5,471,097 | 11/1995 | Shibata | 252/666 |

FOREIGN PATENT DOCUMENTS

| | | |
|---|---|---|
| 55-134998 | 10/1980 | Japan . |
| 4-297058 | 10/1992 | Japan . |

*Primary Examiner*—Sara W. Crane
*Assistant Examiner*—S. V. Clark
*Attorney, Agent, or Firm*—Armstrong, Westerman, Hattori, McLeland & Naughton

[57] ABSTRACT

There is provided a mounting construction which prevents leads of a semiconductor device from being short circuited when the semiconductor device is mounted on a mounting board so that mountability of the semiconductor device is improved. A plurality of outer leads extend from sides of a package of the semiconductor device. A mounting board has a surface on which a plurality of terminals to be electrically connected to the semiconductor device are provided. A mounting member is mounted on the mounting board separately from the semiconductor device. The semiconductor device is attached to the mounting member. The mounting member has a frame member forming a space in which the semiconductor device is placed. A first connecting lead has a first lead connecting portion and a first external connecting portion to be connected to a one of terminals provided on the mounting board. The first external connecting portion extends along a bottom surface of the frame member. A second connecting lead has a second lead connecting portion and a second external connecting portion to be connected to a one of the terminals provided on the mounting board. The second external connecting portion extends along a bottom surface of the frame member. The first external connecting portion and the second external connecting portion are arranged alternately with a predetermined distance apart from each other in a direction along an extending direction of the frame member.

16 Claims, 17 Drawing Sheets

MOUNTING CONSTRUCTION AND METHOD OF A SEMICONDUCTOR DEVICE BY WHICH DEFORMATION OF LEADS IS PREVENTED

BACKGROUND OF THE INVENTION

1. Field of the Invention

The present invention generally relates to a mounting construction and method of a semiconductor device, and more particularly to a mounting construction and method of a semiconductor device which is mounted to a mounting board, and a lead frame used in the mounting construction.

In recent years, semiconductors have become highly integrated, and at the same time a miniaturization of the semiconductor devices is required. In order to satisfy those requirements, a lead pitch of leads extending from a package of a semiconductor device has become extremely narrow.

If the lead pitch is reduced, strength of the leads is also reduced. Accordingly there is a possibility that the leads are deformed due to an external force during delivery, and thus reliability of the semiconductor device is decreased. Additionally, when the semiconductor device having a narrow lead pitch (fine pitch) is directly mounted onto a mounting board, a so-called bridging in which a solder bridges over adjacent leads may occur, and thus mountability of the semiconductor device is deteriorated.

Accordingly, it is desirous to develop a mounting construction and method of a semiconductor device through which a deformation of leads can be prevented, and good mountability is achieved.

2. Description of the Related Art

As a method of preventing a deformation of the leads of the semiconductor device having leads with a fine pitch, the mold carrier ring (MCR) method is known. A semiconductor device manufactured by the MCR method has a construction in which extreme ends of leads extending from a semiconductor package are molded into a frame member (ring-like member) so that the leads are maintained at a predetermined distance away from each other.

FIG. 1 is a plan view of a conventional semiconductor device manufactured by the MCR method. As shown in FIG. 1, the semiconductor device 1 manufactured by the MCR method comprises a semiconductor package 2 and a ring member 3. The semiconductor device 1 is delivered from a manufacturing plant in a state in which the ring member 3 is not separated from the semiconductor package 2.

The semiconductor package 2 has a plastic package 4 in which a semiconductor chip (not shown in the figure) is sealed, a plurality of leads 5 extending from outer sides of the plastic package 4. The ring member 3 is a frame-like member which encircles the semiconductor package 2, and is also formed of a plastic.

Extreme ends of the leads 5 extending from the plastic package 4 are molded in the ring member 3, and thereby the semiconductor package 2 is retained inside the ring member 3. Accordingly, the leads 5 are protected from an external force, and thus deformation of the leads 5 is prevented. Therefore, the leads 5 can be arranged with fine pitches without having a short circuit between adjacent leads, and flatness of the leads 5 can be well maintained.

As mentioned above, the semiconductor device 1 manufactured by the MCR method has the ring member 3 which protects the lead 5 from being deformed, the ring member 3 being provided only to protect the leads 5 from being deformed. Since the semiconductor device 1 is delivered in a state in which the ring member 3 is still attached to the leads 5, the ring member 3 must be removed from the semiconductor package 2 at a user's site where the semiconductor package 2 is assembled in a product.

Accordingly, a lead cutting apparatus to remove the ring member 3 from the semiconductor package 2 must be installed at the user's site, the lead cutting apparatus cutting off the leads 5 at predetermined positions thereof. Since the lead cutting apparatus is required to cut off the leads while maintaining the lead pitch of the leads 5 and preventing a deformation of the leads 5, a high technique is required for manufacturing the lead cutting apparatus. Accordingly, the lead cutting apparatus is expensive, and thus it is not practical to install the lead cutting apparatus at each user's site.

Additionally, after the ring member 3 is removed from the semiconductor package 2, no protection is provided on the leads 5. Therefore, there still be a problem in that the leads 5 are deformed and short circuited during a mounting process of the semiconductor package 2 on to a mounting board. Further, since the leads 5 are arranged with the fine pitch, there still be a problem in that a solder bridge is formed between the adjacent leads 5, resulting in deterioration of mountability.

In the mounting process of the semiconductor package 2, the leads 5 and electrodes formed on a mounting board are soldered by melting solder provided on lead connecting portions after the semiconductor package 2 is placed directly on the mounting board. Accordingly, heat is applied inevitably to the semiconductor package 2 during a mounting process. In such a condition, a heat stress may be generated in the plastic package 4, and thus there is a problem that a crack may be generated in the plastic package 2.

SUMMARY OF THE INVENTION

It is a general object of the present invention to provide an improved and useful mounting construction and method of a semiconductor device in which the above-mentioned problems are eliminated.

A more specific object of the present invention is to provide a mounting construction and method which prevents leads of a semiconductor device from being short circuited when the semiconductor device is mounted on a mounting board so that mountability of the semiconductor device is improved.

Another object of the present invention is to provide a mounting construction and method which can prevent a package of a semiconductor device from being cracked.

In order to achieve the above-mentioned objects, there is provided according to one aspect of the present invention, a mounting construction of a semiconductor device having a plurality of outer leads extending from sides of a package thereof, the mounting construction comprising:

a mounting board having a surface on which a plurality of terminals to be electrically connected to the semiconductor device are provided; and a mounting member being mounted on the mounting board separately from the semiconductor device, the semiconductor device being attached to the mounting member, the mounting member comprising;

a frame member forming a space in which the semiconductor device is placed, the frame member having a bottom surface which faces the surface of the mounting board;

at least one first connecting lead provided to the frame member, the first connecting lead having a first lead connecting portion which makes a contact with a corresponding one of the outer leads of the semiconductor device placed in the space, the first connecting lead having a first external connecting portion to be connected to a corresponding one of the terminals provided on the mounting board, the first external connecting portion extending along the bottom surface of the frame member; and at least one second connecting lead provided to the frame member, the second connecting lead having a second lead connecting portion which makes a contact with a corresponding one of the outer leads of the semiconductor device placed in the space, the second connecting lead having a second external connecting portion to be connected to a corresponding one of the terminals provided on the mounting board, the second external connecting portion extending along the bottom surface of the frame member, the first external connecting portion extending from outside the frame member, and the second external connecting portion extending from the space formed by the frame member, the first external connecting portion and the second external connecting portion being arranged alternately with a predetermined distance apart from each other in a direction along an extending direction of the frame member.

There is provided according to another aspect of the present invention a mounting method of a semiconductor device on a mounting board, the semiconductor device having a plurality of outer leads extending from sides thereof, the semiconductor device being attached on a mounting member having a plurality of connecting leads extending therefrom, the mounting method comprising the steps of:

a) mounting the mounting member onto the mounting board by using the connecting leads; and b) attaching the semiconductor device to the mounting member mounted on the mounting board so that the outer leads make a contact with the connecting leads.

There is provided according to another aspect of the present invention a lead frame used for making the mounting member used for the above-mentioned mounting construction, comprising:

a lead frame body; and a plurality of extending portions extending from the lead frame body, the extending portions corresponding to portions of the first and second connecting leads extending from the frame member when the lead frame is formed to be the mounting member, a length of each of the extending portions corresponding to the first connecting leads is different from a length of each of the extending portions corresponding to the second connecting leads.

Other objects, features and advantages of the present invention will become more apparent from the following detailed description when read in conjunction with the accompanying drawings.

BRIEF DESCRIPTION OF THE DRAWINGS

FIG. 2A is a plane view; FIG. 2B is a partially cross-sectioned side view; FIG. 2C is a bottom view;

FIG. 3A is a plane view; FIG. 3B is a cross-sectional view; FIG. 3C is a bottom view;

DETAILED DESCRIPTION OF THE PREFERRED EMBODIMENTS

Figure 1:
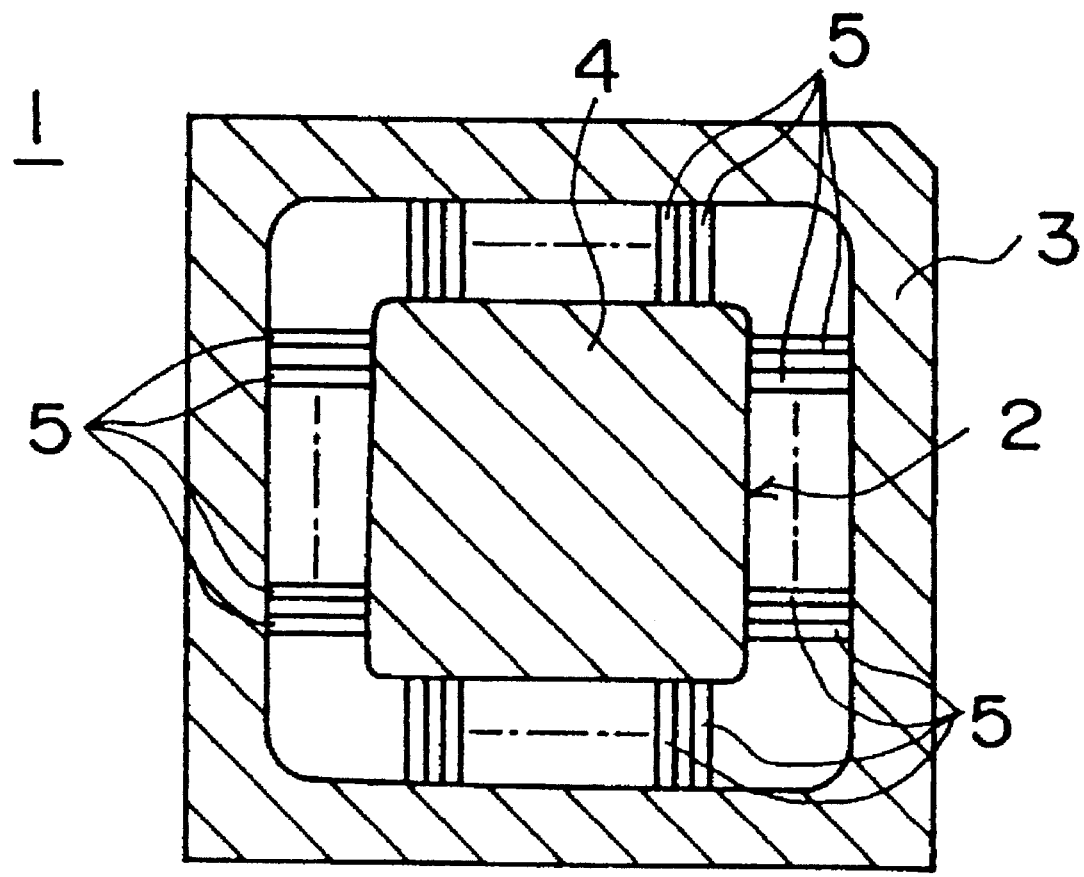
FIG. 1 is a plan view of a conventional semiconductor device manufactured by a CRM method.
Figure 2A:
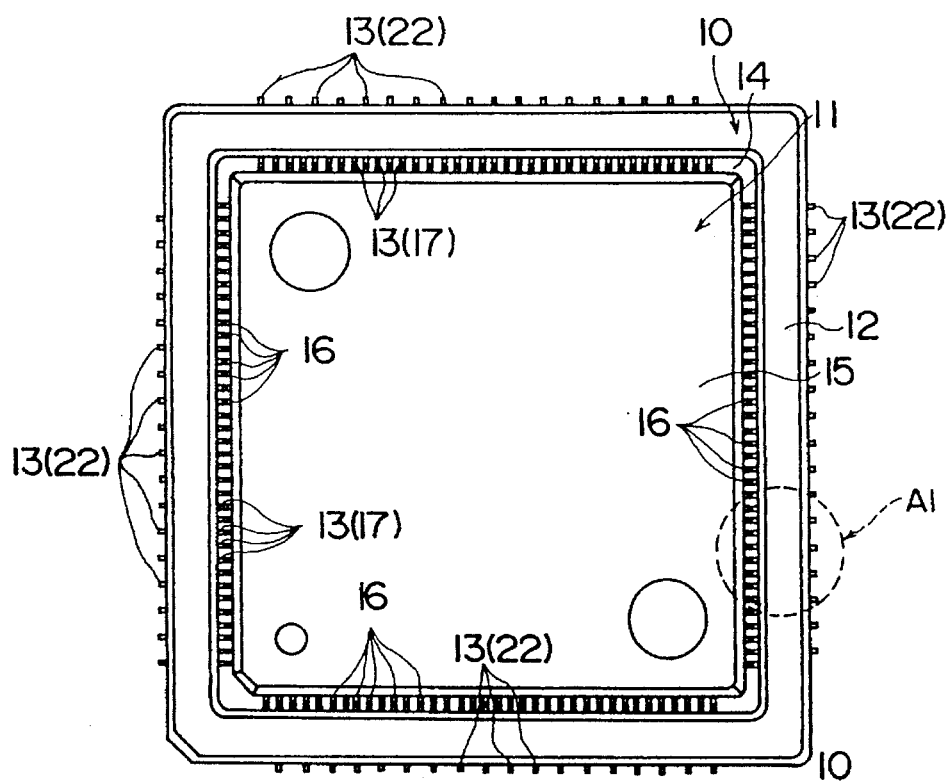
FIGS. 2A, 2B and 2C are views of a mounting construction of a first embodiment of the present invention.
Figure 2B:
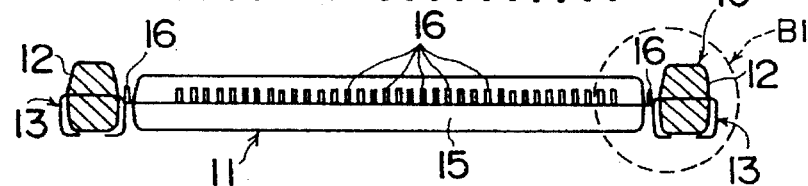
Figure 2C:
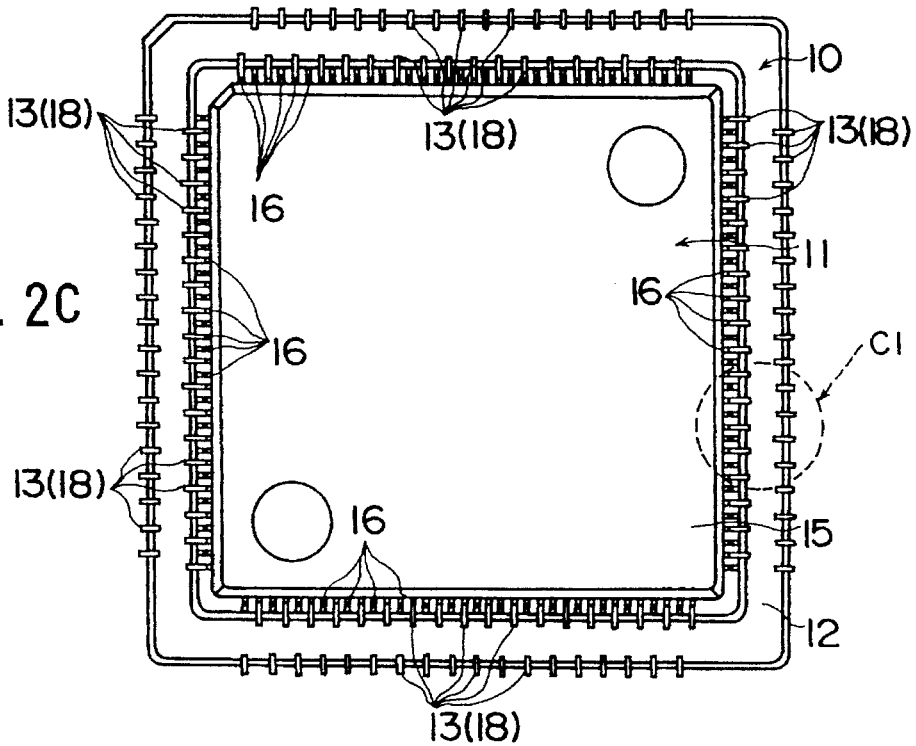
Figure 3A:
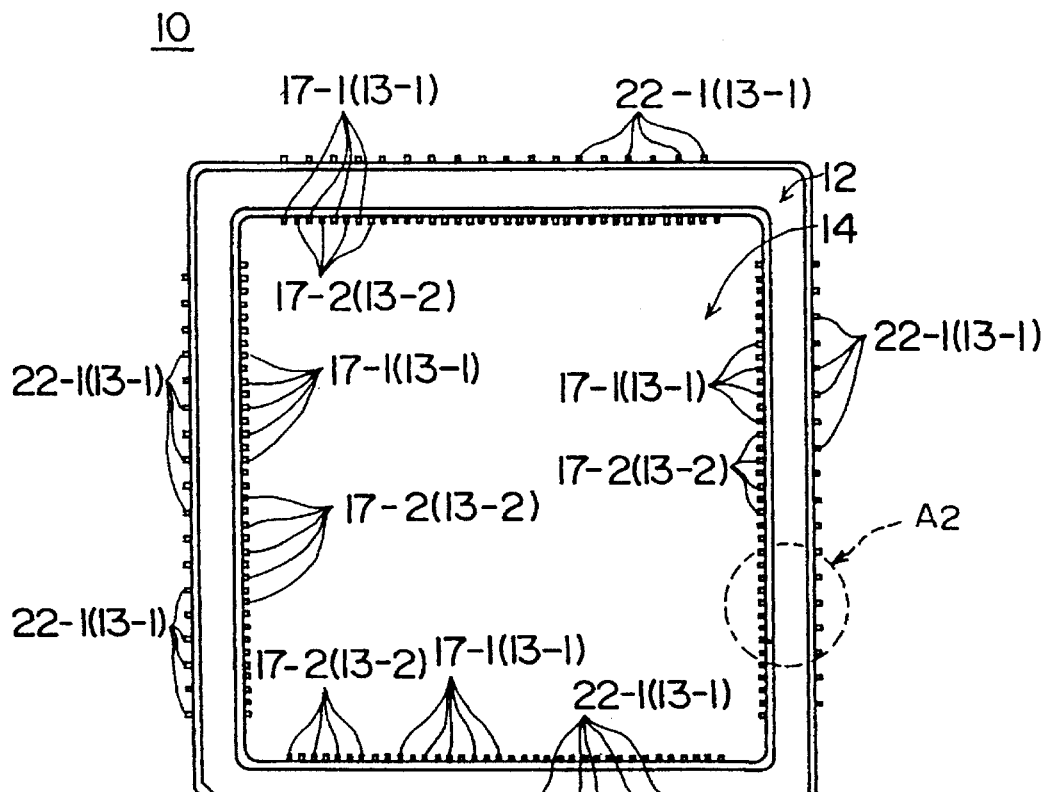
FIGS. 3A, 3B and 3C are views of a mounting member shown in FIGS. 2A, 2B and 2C.
Figure 3B:
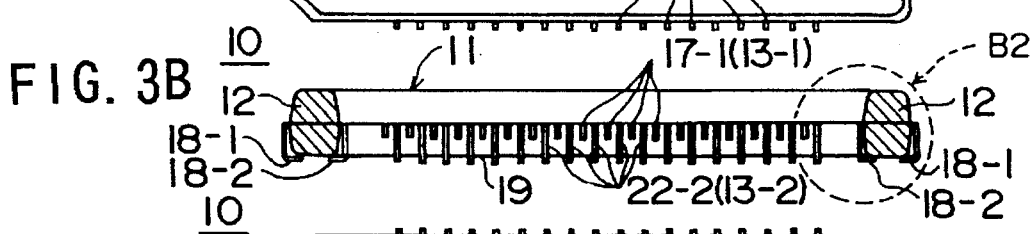
Figure 3C:
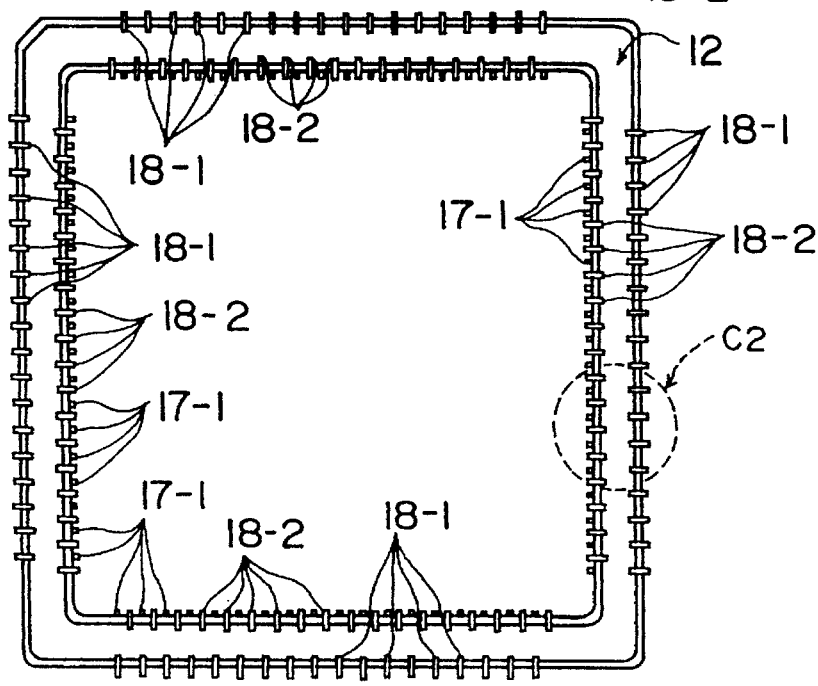

A description will now be given, with reference to FIGS. 2A, 2B and 2C, and FIGS. 3A, 3B and 3C, of a first embodiment of a mounting construction according to the present invention. FIGS. 2A, 2B and 2C are views of a mounting construction of a first embodiment of the present invention; FIG. 2A is a plane view; FIG. 2B is a partially cross-sectioned side view; FIG. 2C is a bottom view. FIGS. 3A, 3B and 3C are views of a mounting member 10 shown in FIGS. 2A, 2B and 2C; FIG. 3A is a plane view; FIG. 3B is a cross-sectional view; FIG. 3C is a bottom view.

The mounting member 10 comprises a frame member 12 and connecting leads 13-1 and 13-2. The frame member 12 is formed of a plastic having a relatively high softening point. The frame member is formed in a square and frame-like shape so that an inner space 14 in which a semiconductor device 11 is placed is provided. A plurality of connecting leads 13-1 and 13-2 are embedded by means of an insert molding. The number of the connecting leads 13-1 and 13-2 corresponds to the number of outer leads 16 provided in the semiconductor device 11. The connecting leads 13-1 and the connecting leads 13-2 are hereinafter referred to as connecting leads 13 as a whole for the sake of convenience.

The connecting leads 13 are made of a lead frame material such as a copper alloy, and solder plating is applied to a portion of each of the connecting leads 13 which portion extends from the frame member 12. A solder plating is also applied to the outer leads 16 of the semiconductor device 11. The solder plating applied to the connecting leads 13 has a melting point higher than that of the solder plating applied to the outer leads 16.

The outer leads of the semiconductor device 11 extend outwardly from a periphery of a plastic package 15 of the semiconductor device 11, and are bent perpendicularly upward.

A description will now be given, with reference to FIGS. 2A through 10, of a structure of the connecting leads 13-1 and 13-2.

Figure 4:
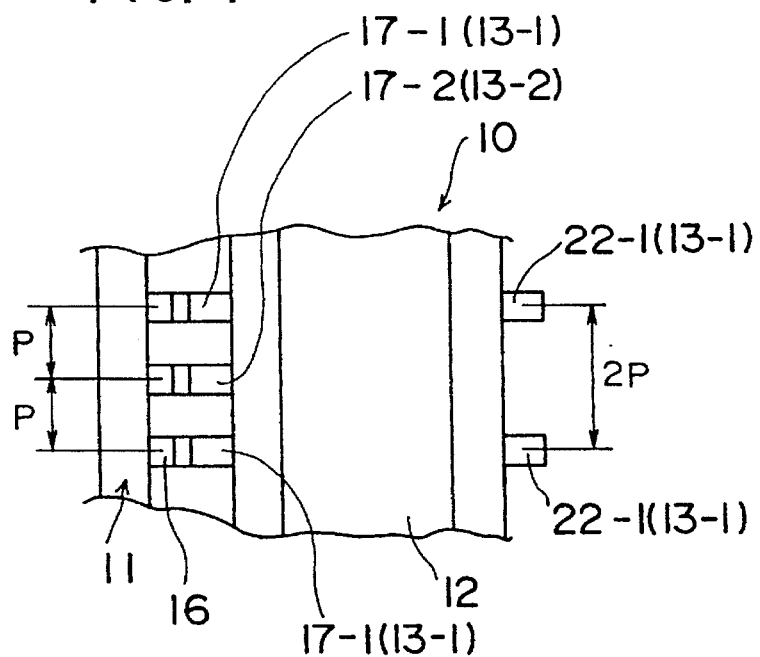
FIG. 4 is an enlarged view of a part encircled by a dashed line A1 of FIG. 2A.
Figure 5:
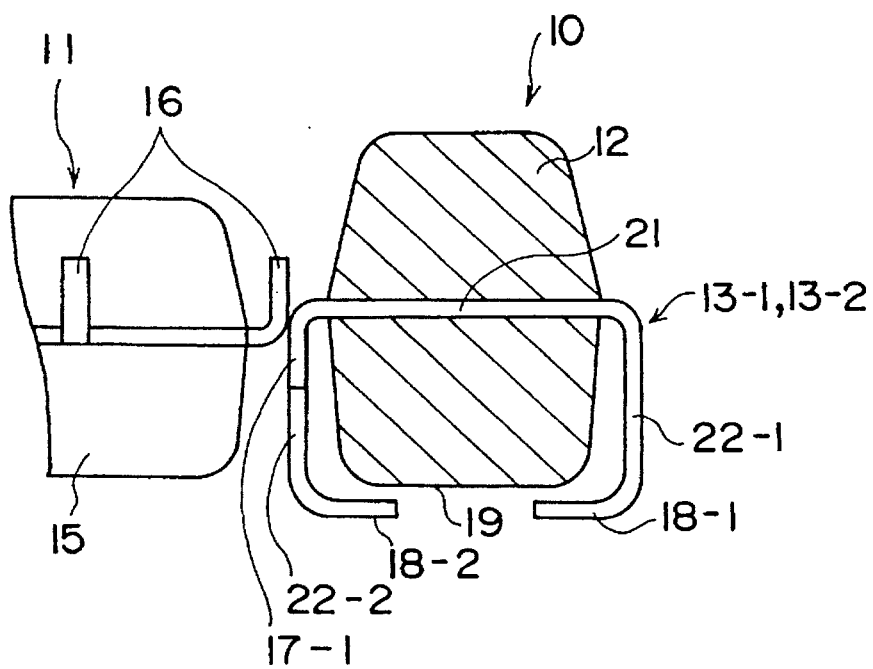
FIG. 5 is an enlarged view of a part encircled by a dashed line B1 of FIG. 2B.
Figure 6:
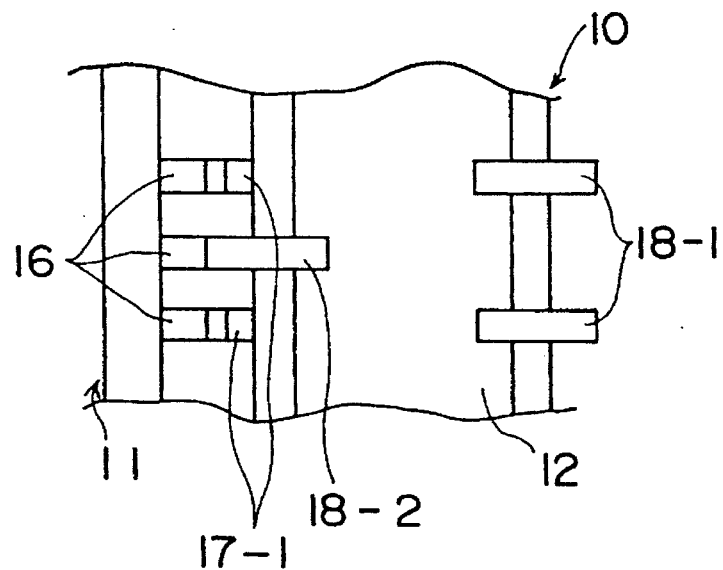
FIG. 6 is an enlarged view of a part encircled by a dashed line C1 of FIG. 2C.
Figure 7:
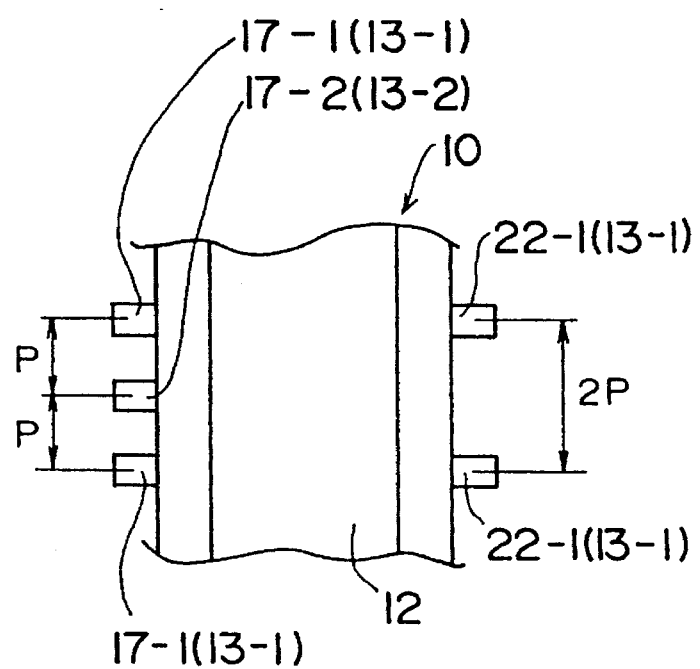
FIG. 7 is an enlarged view of a part encircled by a dashed line A2 of FIG. 3A.
Figure 8:
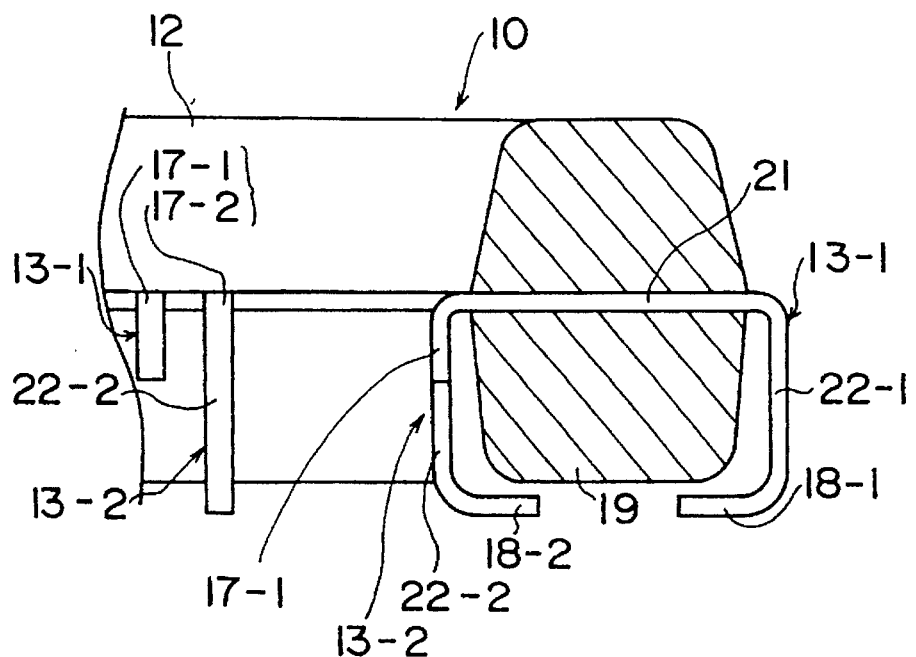
FIG. 8 is an enlarged view of a part encircled by a dashed line B2 of FIG. 3B.
Figure 9:
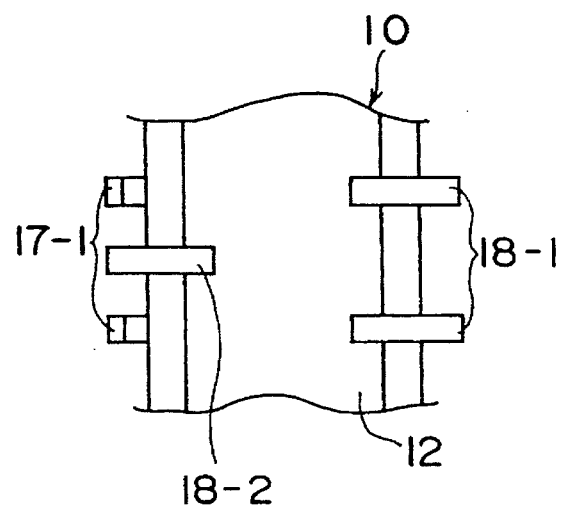
FIG. 9 is an enlarged view of a part encircled by a dashed line C2 of FIG. 3C.
Figure 10:
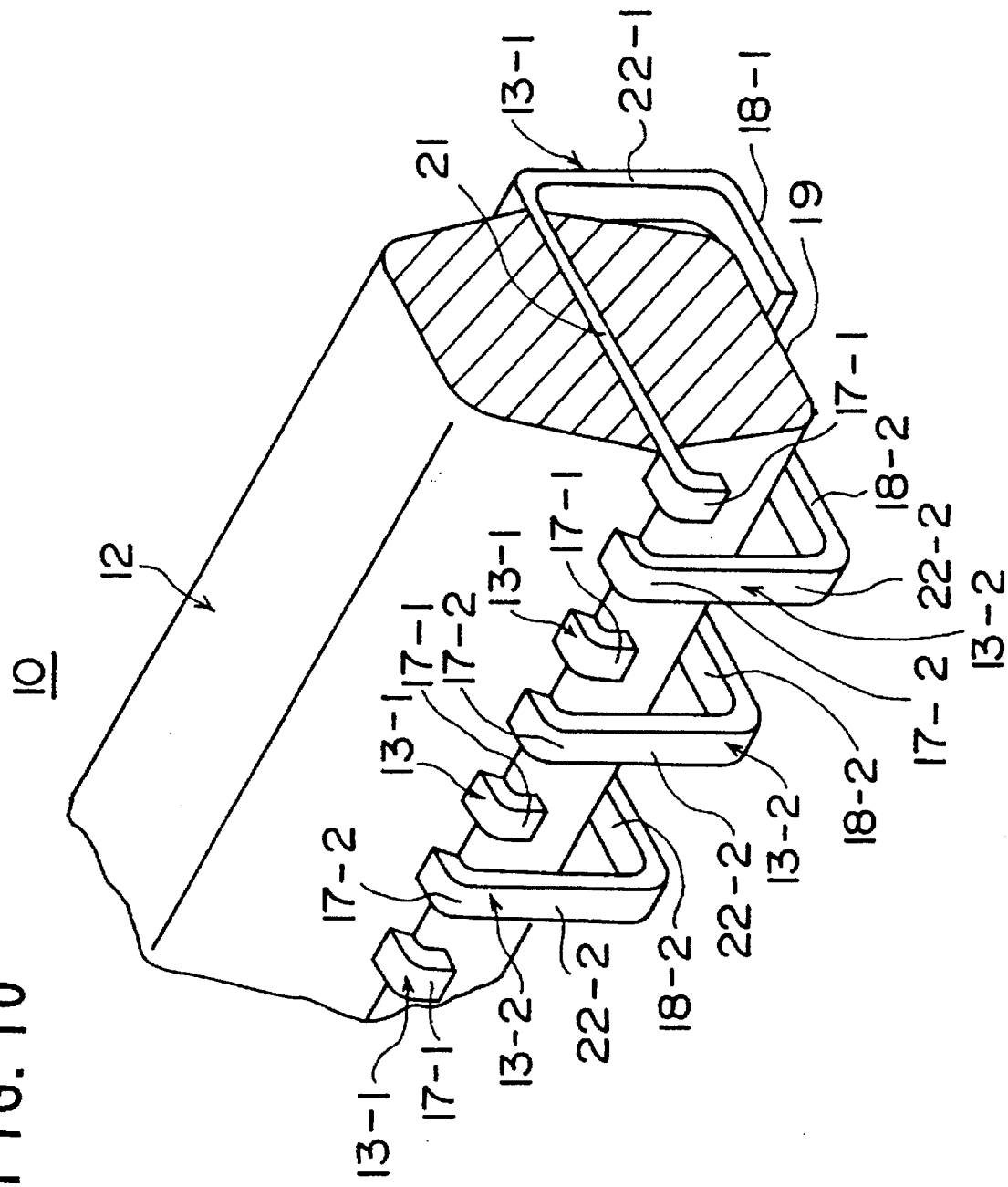
FIG. 10 is an enlarged perspective view of the part encircled by the dashed line A2 of FIG. 3A.

FIG. 4 is an enlarged view of a part encircled by a dashed line A1 of FIG. 2A; FIG. 5 is an enlarged view of a part encircled by a dashed line B1 of FIG. 2B; FIG. 6 is an enlarged view of a part encircled by a dashed line C1 of FIG. 2C; FIG. 7 is an enlarged view of a part encircled by a dashed line A2 of FIG. 3A; FIG. 8 is an enlarged view of a part encircled by a dashed line B2 of FIG. 3B; FIG. 9 is an enlarged view of a part encircled by a dashed line C2 of FIG. 3C; FIG. 10 is an enlarged perspective view of the part encircled by the dashed line A2 of FIG. 3A.

As shown in FIGS. 5, 8 and 10, a part of each of the connecting leads 13 are embedded in the frame member 12, and thereby the connecting leads 13 are fixed to the frame member 12. The part embedded in the frame member is hereinafter referred to as a fixed portion 21. As mentioned above, the number of the connecting leads 13 is the same as the number of outer leads 16 of the semiconductor device 11 placed in the space 14, and positions of the connecting leads 13 corresponds to positions of the respective outer leads 16 when the semiconductor device 11 is placed in the space 14.

In the present embodiment, the two kinds of connecting leads are provided, the connecting leads (first connecting leads) 13-1 and the connecting leads (second connecting leads) 13-2. The first connecting leads 13-1 and the second connecting leads 13-2 are the same in that lead connecting portions 17-1 and 17-2 and external connecting portions 18-1 and 18-2 are integrally formed with the fixed portion 21. Additionally, the first connecting leads 13-1 and the second connecting leads 13-2 are the same in that the lead connecting portions 17-1 and 17-2 are formed in the space 14.

Each of the first connecting leads 13-1 comprises the fixed portion 21, the lead connecting portion 17-1, a downward extending portion 22-1 and an external connecting portion 18-1. The lead connecting portion 17-1 protrudes inward of the space 14. The downward extending portion 22-1 is formed outside the frame member 12, and extends downward along an outer side of the frame member 12. The external connecting portion 18-1 is formed at the end of the downward extending portion 22-1, and extends inward of the frame member 12 along a bottom of the frame member 12.

Each of the second connecting leads 13-2 comprises the fixed portion 21, the downward extending portion 22-2 and the external connecting portion 18-2. The downward extending portion 22-2 is formed inside the frame member 12, and extends downward along an inner side of the frame member 12. The external connecting portion 18-2 is formed at the end of the downward extending portion 22-2, and extends outward of the frame member 12 along the bottom of the frame member 12. In the second connecting lead 13-2, an upper portion of the downward extending portion 22-2 serves as a lead connecting portion 17-2 similarly to the lead connecting portion 17-1 of the first connecting lead 13-1.

As best illustrated in FIG. 10, the first connecting leads 13-1 and the second connecting leads 13-2 are arranged alternately along the frame member 12.

In the above mentioned mounting member 10, when viewing from above as is in FIGS. 4 and 7, the lead connecting portions 17-1 of the first connecting leads 13-1 and the lead connecting portions 17-2 of the second connecting leads 13-2 are arranged alternately in the space 14 of the frame member 12, and a pitch of the connecting leads 13 is the same as the pitch of the outer leads 16 of the semiconductor device 11. The pitch is indicated by P in FIGS. 4 and 7. On the other hand, since only the first connecting leads 13-1 appear outside the frame member 12, a pitch of the connecting leads 13 is twice the pitch P of the connecting leads 13 extending inside the space 14 as indicated by 2P in FIGS. 4 and 7.

Viewing the mounting member 10 from a side as shown in FIGS. 5 and 8, the external connecting portion 18-1 of each of the connecting leads 13-1 extends inward from outside the frame member 12, and the external connecting portion 18-2 of each of the connecting leads 18-2 extends outward from the space 14 which is inside the frame member 12. That is, the external connecting portions 18-1 and 18-2 extend under the bottom of the frame member 12 from opposite sides of the frame member 12.

Additionally, viewing the mounting member 10 from the bottom side as shown in FIGS. 6 and 9, the external connecting portions 18-1 and 18-2 are arranged alternately one from inside and the next from outside of the frame member 12.

According to the above-mentioned arrangement, the pitch of the lead connecting portions 17-1 and 17-2 is equal to the pitch of the outer leads 16 of the semiconductor device 11, and a relatively large distance can be provided between the adjacent external connecting portions 18-1 and 18-2 since they are arranged alternately and parallel to each other. This makes as if the pitch of the external connecting portions 18-1 and 18-2 is extended while the pitch of the lead connecting portions 17-1 and 17-2 is maintained the same.

In order to attach the semiconductor device 11 to the mounting member 10, the semiconductor device 11 is placed in the space 14 inside the frame member 12. At this time, the outer leads 16 make a contact with the respective lead connecting portions 17-1 and 17-2 to have an electrical connection therebetween.

Additionally, when the semiconductor device 11 is placed in the space 14, at least one of the outer leads 16 and the lead connecting portions 17-1 and 17-2 are elastically bent so as to generate a pressing force so that a good electrical contact can be provided between the outer leads 16 and the respective lead connecting portions 17-1 and 17-2. Accordingly, there is no need to provide any other connecting constructions, and thus the mounting construction of the present embodiment is simple. Additionally, since the outer leads 16 and the lead connecting portions 17-1 and 17-2 are connected with the elastic force, a reliable connection is achieved.

Further, since the semiconductor device 11 is held in the space 14 by the elastic force between the outer leads 16 and the lead connecting portions 17-1 and 17-2, the semiconductor device 11 can be detachably attached to the mounting member 10. Accordingly, if a defect is found in the semiconductor device 11 after it is attached to the mounting member 10 which is mounted on a mounting board, the semiconductor device can be easily detached from the mounting member 10 without removing the mounting member 10 from the mounting board.

A description will now be given, with reference to FIGS. 11 to 14, of a mounting method of the semiconductor device 11 onto a mounting board 20 by using the mounting member 10.

Figure 11:
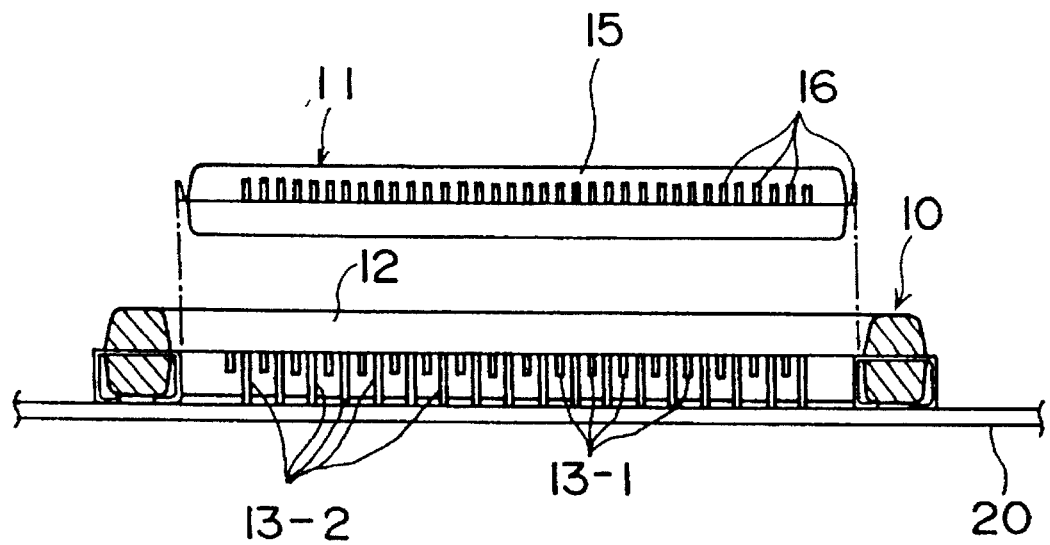
FIG. 11 is a side view showing an attachment of the semiconductor device to the mounting member shown in FIGS. 3A, 3B and 3C.
Figure 12:
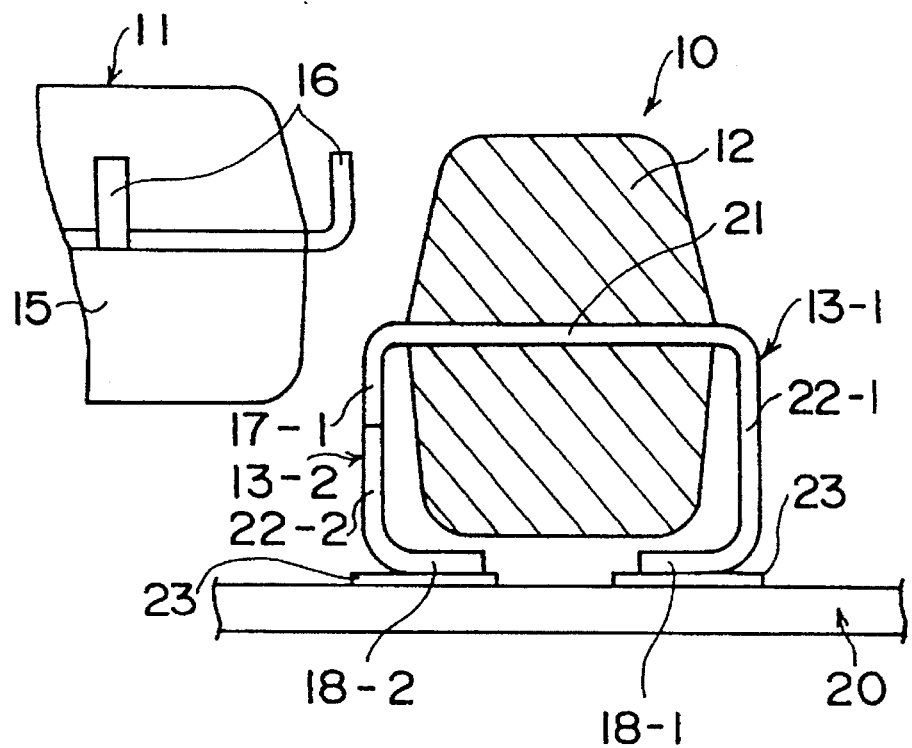
FIG. 12 is an enlarged cross-sectional view of the mounting member mounted on a mounting board.
Figure 13:
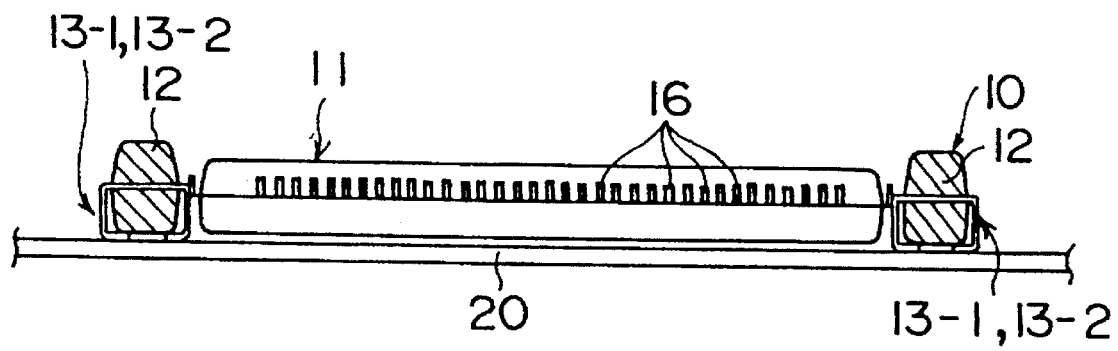
FIG. 13 is a side view showing a state in which the semiconductor device is attached to the mounting member shown in FIGS. 3A, 3B and 3C.
Figure 14:
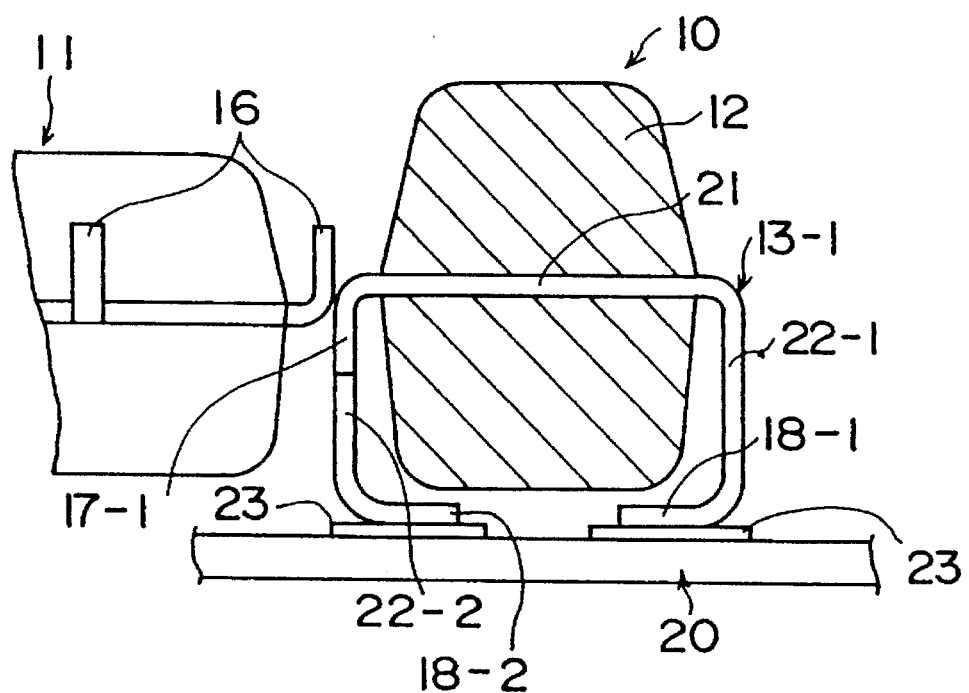
FIG. 14 is a an enlarged cross-sectional view of the mounting member shown in FIG. 13 to which the semiconductor device is attached.

In order to mount the semiconductor device 11 onto the mounting board 20, the mounting member 10 according to the present invention is mounted onto the mounting board 20 first. FIGS. 11 and 12 show a state in which the mounting member 10 is mounted on the mounting board 20. As mentioned before, the external connecting portions 18-1 and 18-2 are provided on the bottom side of the mounting member 10, the bottom side facing the mounting board 20. Electrode pads 23 are provided on the mounting board 20 at portions corresponding to the external connecting portions 18-1 and 18-2. The external connecting portions 18-1 and 18-2 are connected to the respective electrode pads 23 by means of soldering.

When the external connecting portions 18-1 and 18-2 are soldered to the electrode pads 23, the mounting member 10 and the mounting board 20 together are treated by a solder reflow process. In this process, since the distance between adjacent external connecting portions 18-1 and 18-2 are large, a formation of the solder bridge over the adjacent external connecting portions 18-1 and 18-2 is prevented, and thus mountability of the semiconductor device 11 is improved. Additionally, since the distance between the adjacent electrode pads 23 can be made large corresponding to the large distance between the adjacent external connecting portions 18-1 and 18-2, less accuracy is sufficient for forming the electrode pads 23, and thus the electrode pads 23 can be formed easily.

Additionally, since the semiconductor device 11 is detachably attached to the mounting member 10, the semiconductor device 11 can be removed from the mounting member 10 during the solder reflow process. Accordingly, an excessive heat is not applied to the semiconductor device 11, and thus damaging, such as a package crack, of the semiconductor device 11 due to a heat stress can be prevented.

In the present embodiment, the frame member 12 of the mounting member 10 is formed as a separate part from the package 15 of the semiconductor device 11. Accordingly, the frame member 12 can be formed of a material having a heat resistance, and a material suitable for molding can be selected for the package 15 of the semiconductor device 11, and thus the package 15 and frame member 20 are both improved in their characteristics.

It should be noted that since the downward extending portion of each of the lead connecting portions 17-1 is made shorter than a distance between the fixed portion 21 and the bottom of the frame member 12 as shown in FIGS. 8 and 10, the lead connecting portions 17-1 do not become obstacles to a soldering operation when the external connecting portions 18-1 and 18-2 are soldered to the mounting board 20.

After the mounting member 10 is mounted to the mounting board 20, the semiconductor device 11 is attached to the mounting member 10 by simply pressing the semiconductor device 11 into the space 14 inside the frame member 12. Accordingly, the electrical connecting between the outer leads 16 and the lead connecting portions 17-1 and 17-2 is made by a simple operation. Additionally, because the semiconductor device is surrounded by the frame member 12, the semiconductor device 11 is protected from an external force applied in directions where the frame member 12 is positioned.

In the above mentioned mounting method using the mounting member 10, a semiconductor device having a conventional regular package can be used, an upper portion and a lower portion of the package being the same in shape. Additionally, in a state in which the semiconductor device 11 is attached to the mounting member 10, the heights of the semiconductor device 11 and the frame member 12 are almost the same, and thus the maximum height of the semiconductor device 11 and the mounting member 10 together when they are mounted on the mounting board 20 is maintained to be as small as possible.

It should be noted that by fixing the semiconductor device 11 to the frame member 12 by applying adhesive after the semiconductor device 11 is attached to the mounting member 10, the semiconductor device 11 can be securely attached to the mounting member 10.

Figure 15:
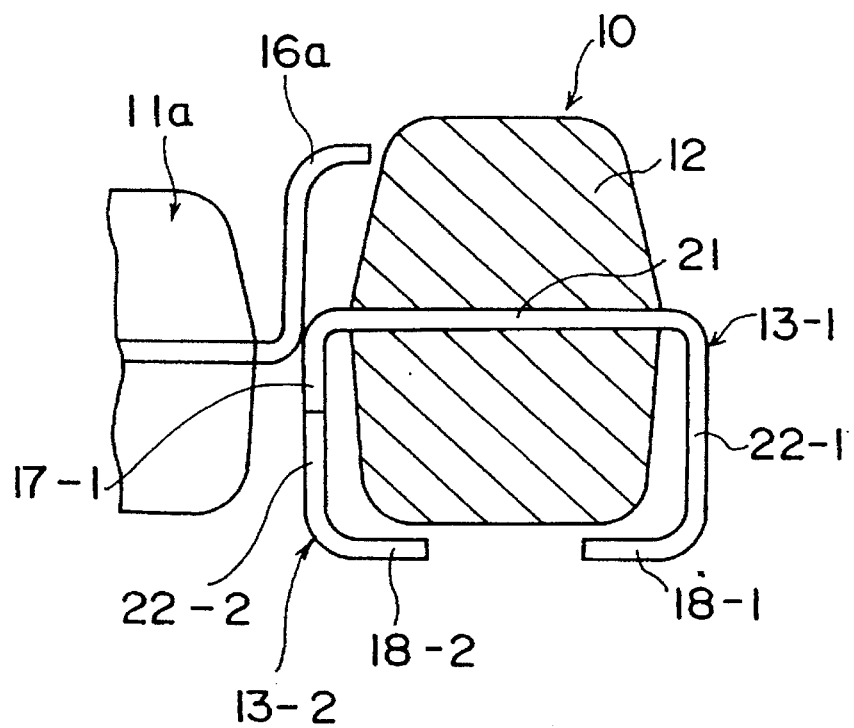
FIG. 15 is a cross-sectional view of a variation of the semiconductor device which can be attached to the mounting member shown in FIG. 3A.
Figure 16:
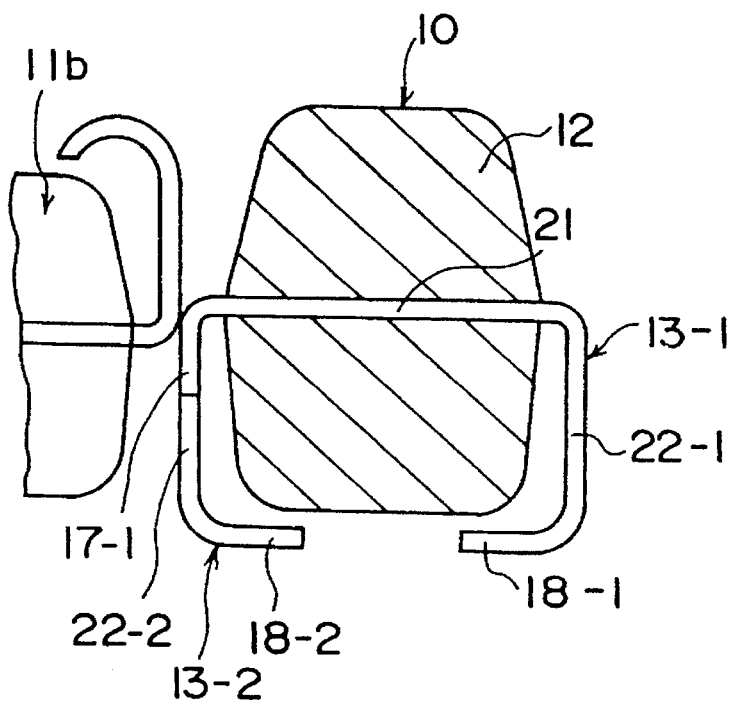
FIG. 16 is a cross-sectional view of another variation of the semiconductor device which can be attached to the mounting member shown in FIGS. 3A, 3B and 3C.

FIGS. 15 and 16 show variations of the semiconductor device 11 which can be attached to the mounting member 10. As shown in FIG. 15, a semiconductor device 11a having outer leads 16a can be attached to the mounting member 10 of the present invention. The outer leads 16a are different from the outer leads 16 in that each of the outer leads 16a is bent like a so-called gull wing type. Additionally, as shown in FIG. 16, a semiconductor device 11b having a so-called leadless chip carrier (LCC) type package can be attached to the mounting member 10. Other semiconductor devices having outer leads which fit the lead connecting portions 17-1 and 17-2 may be attached to the mounting member 10 according to the present invention.

Figure 17:
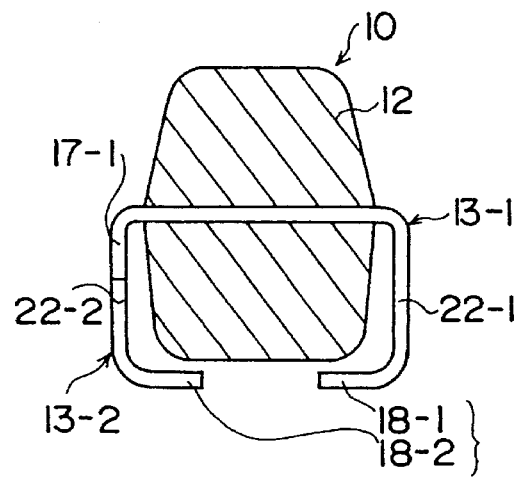
FIG. 17 is a side view of a variation of the connecting leads shown in FIGS. 2A, 2B and 2C.
Figure 18:
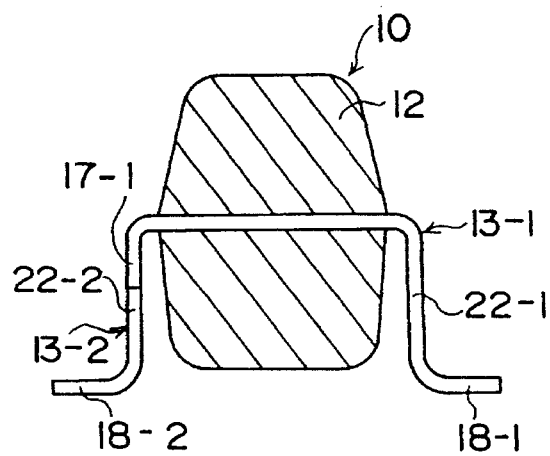
FIG. 18 is a side view of another variation of the connecting leads shown in FIGS. 2A, 2B and 2C.
Figure 19:
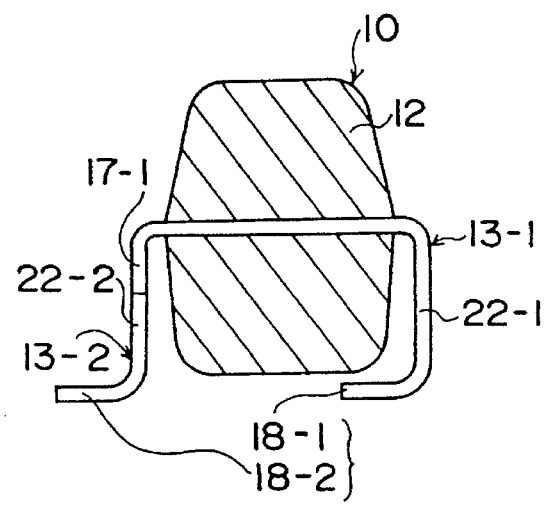
FIG. 19 is a side view of another variation of the connecting leads shown in FIGS. 2A, 2B and 2C.

FIGS. 17, 18 and 19 show variations of the connecting leads 13 which can be applied to the mounting member 10. The variation shown in FIG. 17 has the external connecting portions 18-1 and 18-2 which are described above. The variation of the connecting leads 13 shown in FIG. 18 has external connecting portions 18-1 and 18-2 each extending in opposite directions. The variation of the connecting leads 13 shown in FIG. 19 has external connecting portions 18-1 and 18-2 each extending in the same direction. By using the variation of the connecting leads 13 shown in FIGS. 18 or 19, the distance between the adjacent external connecting portions 18-1 and 18-2 can be greater than that of the one shown in FIG. 17, and thus the mountability can be more improved.

A description will now be given of a second embodiment according to the present invention. FIGS. 20 to 23 show a mounting member 30 of the second embodiment according to the present invention. In the above-mentioned first embodiment, the outer leads 16 are connected to the lead connecting portions 17-1 and 17-2 of the mounting member 10 in the inside of the frame member 12. On the other hand, the second embodiment is characterized in that outer leads 36 of the semiconductor device 31 are connected to lead connecting portions 37-1 and 37-2 outside a frame 32.

The mounting member 30 of the second embodiment comprises the frame member 32 and two kinds of the connecting leads 33-1 and 33-2. The frame member 32 is formed in a square and frame-like shape so that an inner space 34 in which the semiconductor device 31 is placed is provided. The number of the connecting leads 33-1 and 33-2 corresponds to the number of outer leads 36 provided in the semiconductor device 31. In this embodiment, the frame member 32 is not formed above the connecting leads 33-1 and the connecting leads 33-2, and thus exposed portions 41 are formed on a top surface of the frame member 32.

Similarly to the first embodiment, each of the connecting leads 33-1 comprises the exposed portion 41, a lead connecting portion 37-1, a downward extending portion 32-1 and an external connecting portion 38-1. The lead connecting portion 37-1 protrudes outward from the frame member 32. The downward extending portion 32-1 is formed inside the frame member 32, and extends downward along an inner side of the frame member 32. The external connecting portion 38-1 is formed at the end of the downward extending portion 32-1, and extends outward of the frame member 32 along a bottom of the frame member 32.

Each of the connecting leads 33-2 comprises the exposed portion 41, the downward extending portion 32-2 and the external connecting portion 38-2. The downward extending portion 32-2 is formed outside the frame member 32, and extends downward along the outer side of the frame member 32. The external connecting portion 38-2 is formed at the end of the downward extending portion 32-2, and extends inward of the frame member 32 along the bottom of the frame member 32.

Similarly to the above-mentioned first embodiment, the connecting leads 33-1 and the connecting leads 33-2 are arranged alternately along the frame member 32.

Figure 20:
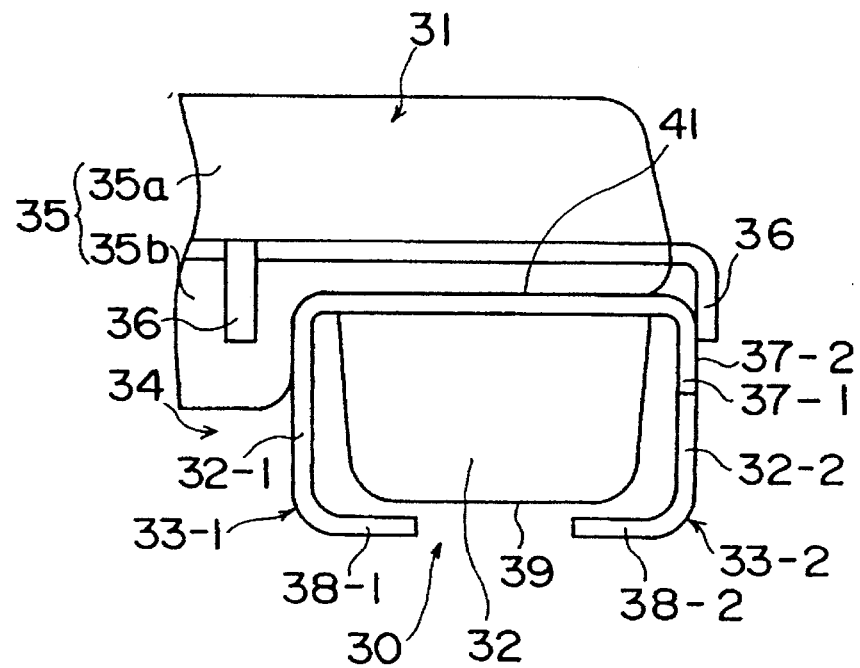
FIG. 20 is a side view of parts of the mounting member and the semiconductor device of a second embodiment according to the present invention in a state in which the semiconductor device is placed on the mounting member.
Figure 24A:
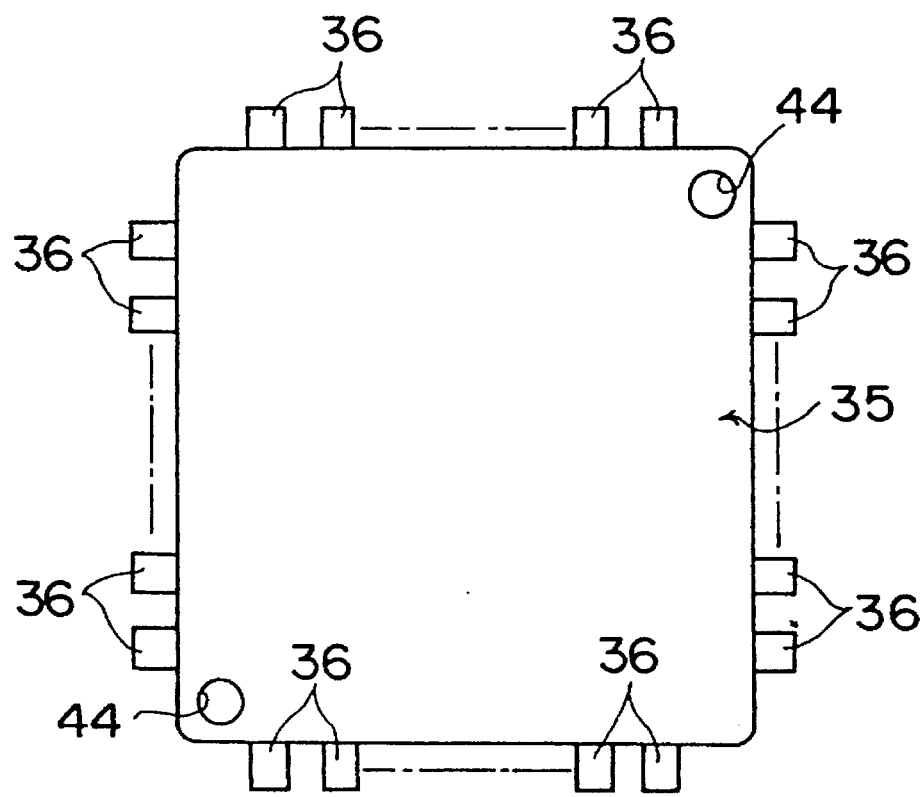
FIG. 24A is a plan view of a semiconductor device to be mounted on the mounting member shown in FIG. 20.
Figure 24B:
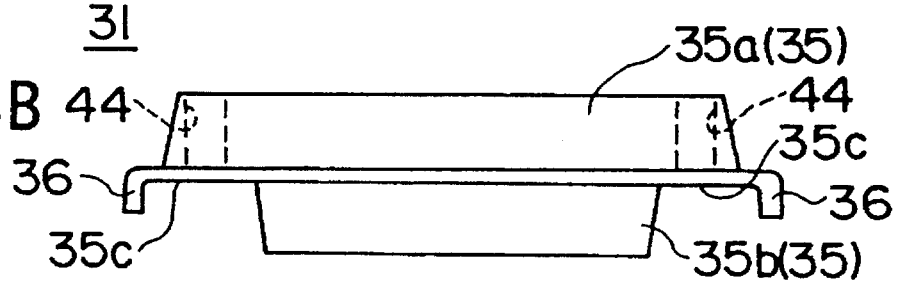
FIG. 24B is a side view of an example of the semiconductor device shown in FIG. 24A.
Figure 24C:
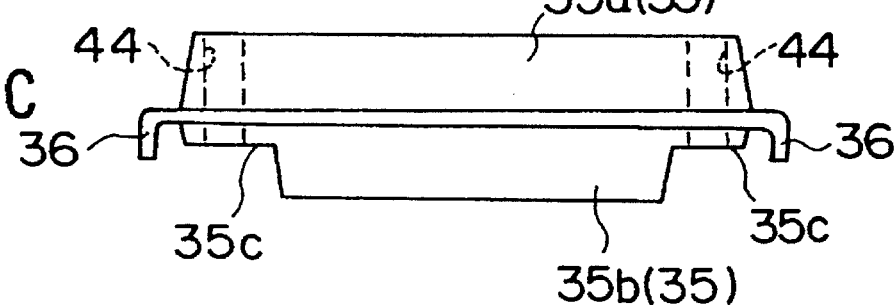
FIG. 24C is a side view of another example of the semiconductor device shown in FIG. 24A.

FIGS. 24A, 24B show an example of the semiconductor device 31 to be attached to the mounting member 30; FIG. 24A is a plan view; FIG. 24B is a side view. FIG. 24C is a side view of a variation of the semiconductor device shown in FIGS. 24A and 24B. The semiconductor device 31 shown in FIG. 24A and 24B comprises a plastic package 35 from which periphery the outer leads 36 extend outward. An extreme end of each of the outer leads 36 is bent downward. As shown in FIG. 24B, a lower half 35b of the package 35 is smaller than an upper package 35a of the package 35, the outer leads 36 extending between the upper half 35a and the lower half 35b. Accordingly, a stage 35c is formed between the upper package 35a and the lower package 35b. The stage 35c may be formed in the lower half 35b as shown in FIG. 24C. It should be noted that FIG. 20 shows a state in which the semiconductor device shown in FIG. 24C is attached to the mounting member 30.

Figure 21:
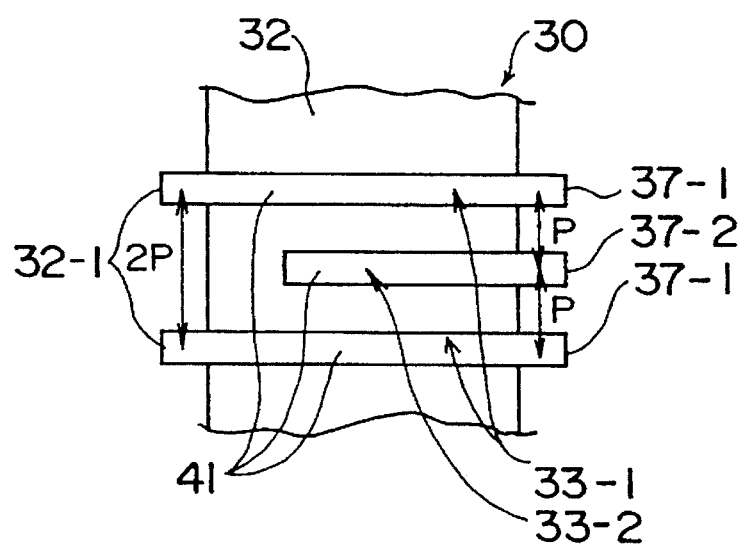
FIG. 21 is a plan view of a part of the mounting member shown in FIG. 20.

In the above mentioned mounting member 30, when viewing form above as is in FIG. 21, the lead connecting portions 37-1 of the connecting leads 33-1 and the lead connecting portions 37-2 of the connecting leads 33-2 are arranged alternately, and a pitch of the connecting leads 33-1 and 33-2 is the same as the pitch of the outer leads 36 of the semiconductor device 31. The pitch is indicated by P in FIG. 21. On the other hand, since only the connecting leads 33-1 appear inside the frame member 32, a pitch of the connecting leads 33-1 is twice the pitch P of the connecting leads 33-1 and 33-2 extending outward of the frame member 32 as indicated by 2P in FIG. 21.

Figure 22:
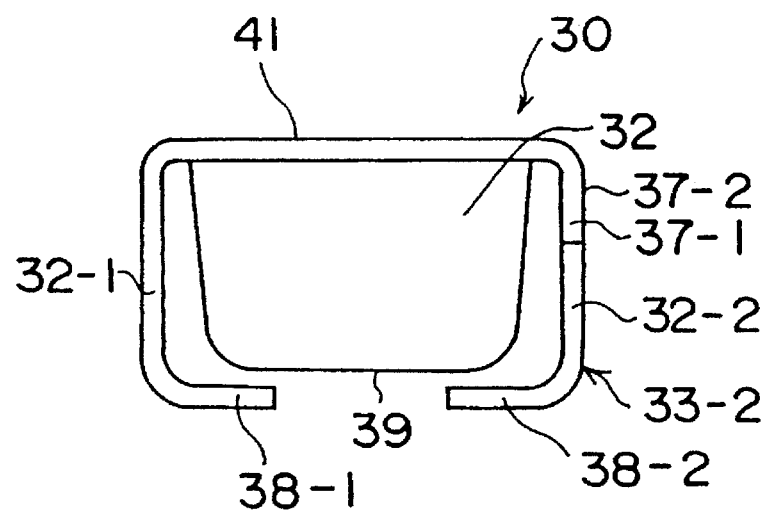
FIG. 22 is a side view of a part of the mounting member shown in FIG. 20.
Figure 23:
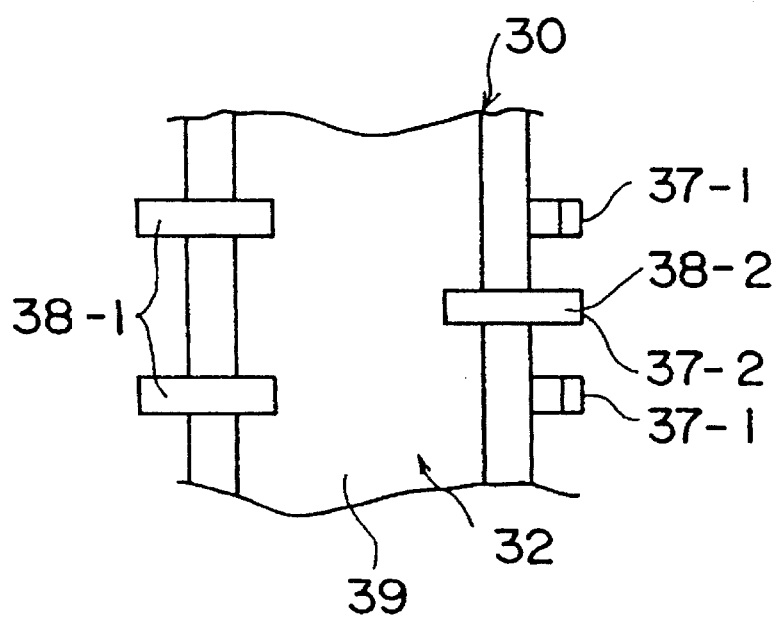
FIG. 23 is a bottom view of a part of the mounting member shown in FIG. 20.

Viewing the mounting member 30 from a side as shown in FIG. 22, the external connecting portion 38-1 of each of the connecting leads 33-1 extends outward from the space 34, and the external connecting portion 38-2 of each of the connecting leads 38-2 extends inward from outside the frame 34. That is, the external connecting portions 38-1 and 38-2 extend under the bottom of the frame member 32 from opposite sides of the frame member 32.

Additionally, viewing the mounting member 30 from the bottom side as shown in FIG. 18, the external connecting portions 38-1 and 38-2 are arranged alternately one from inside and the next from outside of the frame member 32.

According to the above-mentioned arrangement, the pitch of the lead connecting portions 37-1 and 37-2 is equal to the pitch of the outer leads 36 of the semiconductor device 11, and a relatively large distance can be provided between the adjacent external connecting portions 38-1 and 38-2 since they are arranged alternately and parallel to each other. This makes as if the pitch of the external connecting portions 38-1 and 38-2 is extended while the pitch of the lead connecting portions 37-1 and 37-2 is maintained the same. Accordingly, the second embodiment has the same advantages as that of the first embodiment mentioned above.

Additionally, since the outer leads 36 are connected to the lead connecting portions 37-1 and 37-2 provided outside the frame member 32, the semiconductor device 31 is held in a state in which the semiconductor device 31 is placed on the frame member 32, the semiconductor device 31 can be reliably attached to the mounting member 30. Additionally, the connection of the outer leads 36 and the lead connecting portions 37-1 and 37-2 can be easily inspected by visual check.

Figure 25:
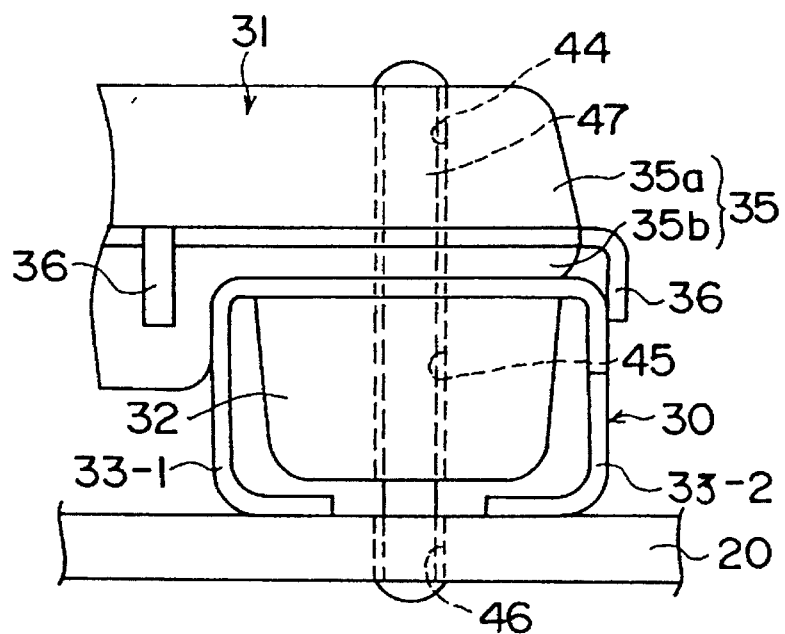
FIG. 25 is a part of the mounting construction in which the mounting member and the semiconductor device shown in FIG. 20 are mounted on the mounting board shown in FIG. 11.

FIG. 25 is a view of an example of a mounting construction using the mounting member 30 shown in FIG. 20.

Figure 28:
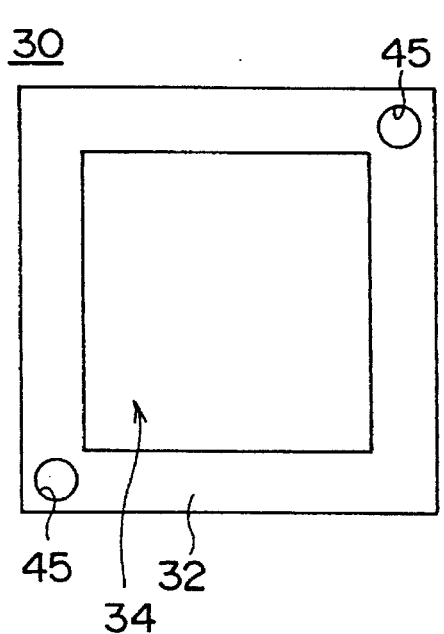
FIG. 28 is a plan view of the mounting member shown in FIG. 24A.

In the mounting construction shown in FIG. 25, a pair of through holes 44 are formed along a diagonal line of the package 35 as shown in FIG. 24A, and a pair of through holes 45 are formed in the mounting frame 32 as shown in FIG. 28. It should be noted that connecting leads 33-1 and 33-2 are not shown in FIG. 28. The through holes 44 of the semiconductor device 31 align with the respective through holes 45 of the frame member 32 when the semiconductor device 31 is attached to the mounting member 30.

Additionally, the mounting board 20 on which the semiconductor device 31 is mounted is provided with a pair of through holes 46 in positions respectively corresponding to the through hole 45 of the mounting member 30. Accordingly, when the mounting member 30 and the semiconductor device 31 are mounted on the mounting board 20, the through holes 44, 45 and 46 are aligned with each other.

In the mounting construction shown in FIG. 25, a pin 47, which serves as a fixing member, is inserted into the aligned through holes 44, 45 and 46. The semiconductor device 31, the mounting member 30 and the mounting board 20 are fixed together by inserting the pin 47 into the through holes 44, 45 and 46, and caulking opposite ends of the pin 47. Accordingly, the semiconductor device 31, the mounting member 30, and the mounting board 20 are fixed together by a simple means. It should be noted that the fixing member is not limited to the pin 47, and a screw and a nut may be used instead.

Figure 26:
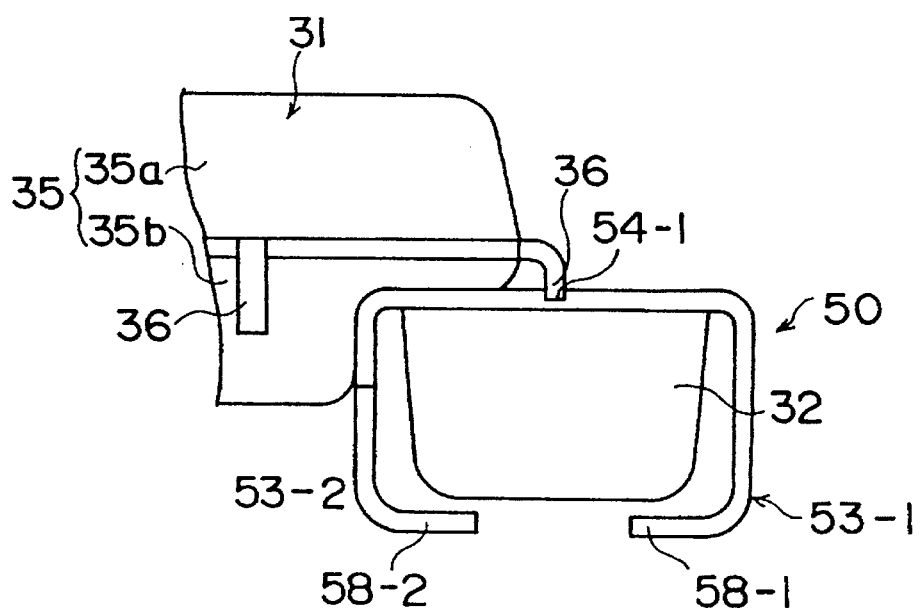
FIG. 26 is a side view of parts of a mounting member and a semiconductor device of a third embodiment according to the present invention in a state in which the semiconductor device is attached to the mounting member.
Figure 27:
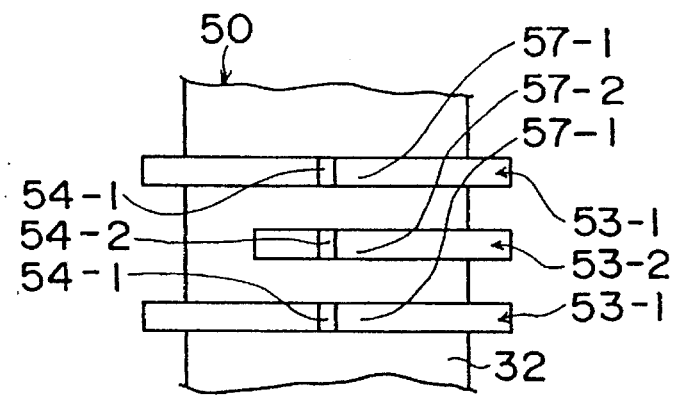
FIG. 27 is a plan view of a part of the mounting member shown in FIG. 26.

A description will now be given of a mounting member 50 of a third embodiment according to the present invention. FIGS. 26 and 27 show the mounting member 50 of the third embodiment according to the present invention. In FIGS. 26 and 27, parts that are the same as the parts of the above-mentioned mounting member 30 of the second embodiment are given the same reference numerals, and descriptions thereof will be omitted.

In the above-mentioned second embodiment, the outer leads 36 of the semiconductor device 31 are connected to the respective lead connecting portions 37-1 and 37-2 outer side of the frame member 32. However, in this embodiment, the outer leads 36 of the semiconductor device 31 are connected to the respective lead connecting portions 57-1 and 57-2 in the middle of the frame member 32.

More specifically, the connecting leads 53-1 and 53-2 are exposed on the frame member 32, and the lead connecting portions 57-1 and 57-2 are formed in the exposed portions of the connecting leads 53-1 and 53-2. Fitting portions 54-1 and 54-2 are formed on the lead connecting portions 57-1 and 57-2 so that ends of the outer leads 36 fit in the respective fitting portions 54-1 and 54-2 as shown in FIG. 26. The fitting portions 54-1 and 54-2 are formed by means of, for example, a half etching.

According to the above-mentioned construction of the mounting member 50, the outer leads 16 and 36 of the above-mentioned first and second embodiments are not needed to be connected with an elastic force to the lead connecting portions 17-1, 17-2, 37-1 and 37-2. Accordingly, the connecting construction of the outer leads 36 is simplified. Additionally, the outer leads 36 are connected to the lead connecting portions 57-1 and 57-2 each having a relatively large area, the connecting operation is easily performed.

Further, since the fitting portions 54-1 and 54-2 are formed on the lead connecting portions, 57-1 and 57-2, a positioning of the semiconductor device relative to the frame member 32 can be easily performed, and at the same time the electrical connection between the outer leads 36 and the lead connecting portions 57-1 and 57-2 is ensured. It should be noted that in the mounting member 50 of the third embodiment, the external connecting portions 58-1 and 58-2 are also arranged in the alternate relationship, and thus the mountability is improved and the advantages of the first and second embodiments can be achieved.

Figure 29:
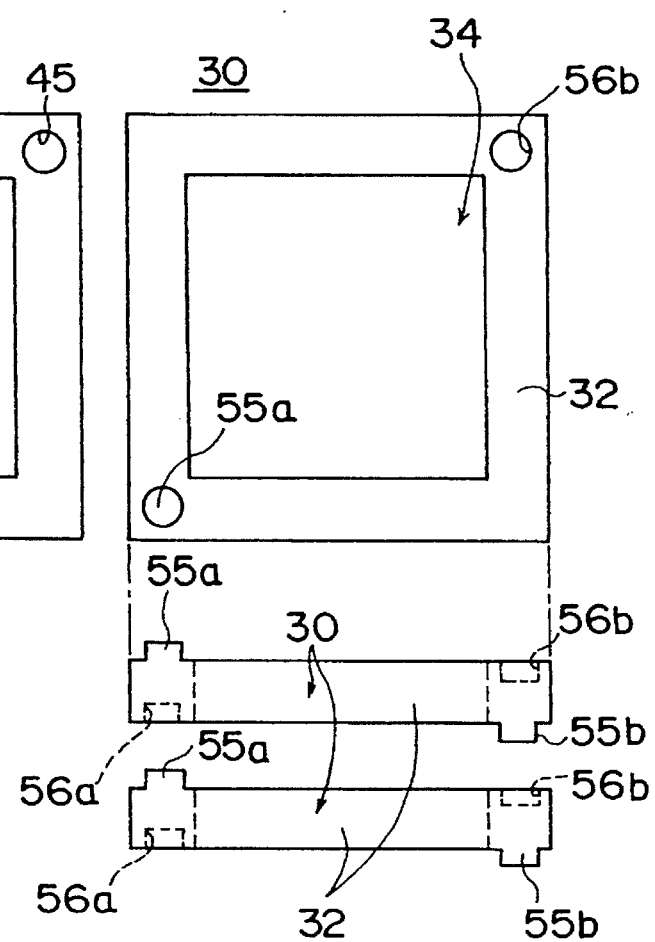
FIG. 29 is a plan view of a variation of the mounting member shown in FIG. 24A.

FIG. 29 shows a variation of the mounting member 30. The frame member 32 of the variation of the mounting member 30 shown in FIGS. 29 has protrusions 55a and 55b and recesses 56a and 56b formed on opposite corners along a diagonal line. The protrusions 55a and the recesses 56a fit to each other, and the protrusions 55b and the recesses 56b fit to each other when one mounting member 30 is placed on another mounting member 30. According to this construction of the mounting member 30, a plurality of the mounting members 30 can be placed in a stacked relationship to each other without falling. Additionally, a positioning of the mounting member 30 relative to the mounting board 20 can be performed by using the protrusion 55b and the recess 56a formed on the surface opposite to the mounting board 20. It should be noted that connecting leads 33-1 and 33-2 are not shown in FIG. 29.

Figure 30:
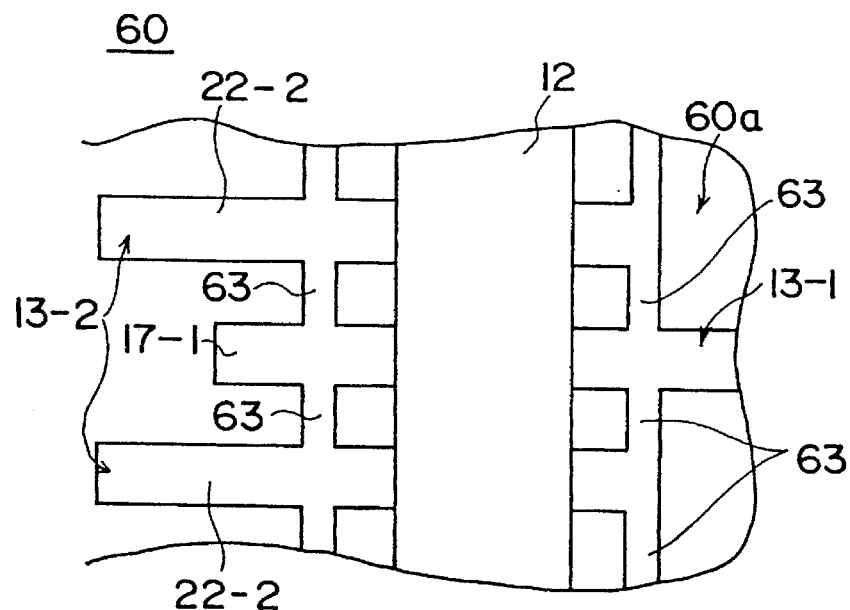
FIG. 30 is a plan view of a part of a lead frame used for forming the mounting member shown in FIGS. 3A, 3B and 3C.

FIG. 30 is an enlarged partial view of a lead frame 60 used for forming the mounting member 10 of the first embodiment. The lead frame 60 is molded in the frame member 12 by means of insert molding. A plurality of connecting leads 13-1 and 13-2 are formed so as to extend from a main portion 60a of the lead frame 60. A length of each of the connecting leads 13-2 extending inward of the frame member 12 (on the left side in the figure) is made longer than a length of a portion of the adjacent one of connecting leads 13-1 extending inward of the frame member 12 (on the left side in the figure). A length of each of the connecting leads 13-2 extending outward of the frame member 12 (on the right side in the figure) is made shorter than a length of a portion of the adjacent one of connecting leads 13-1 extending outward of the frame member 12 (on the left side in the figure). By forming the lead frame 60 in the above-mentioned configuration, the mounting member 10 can be easily formed by bending the lead frame 60 at appropriate portions and removing unnecessary portions.

Figure 31:
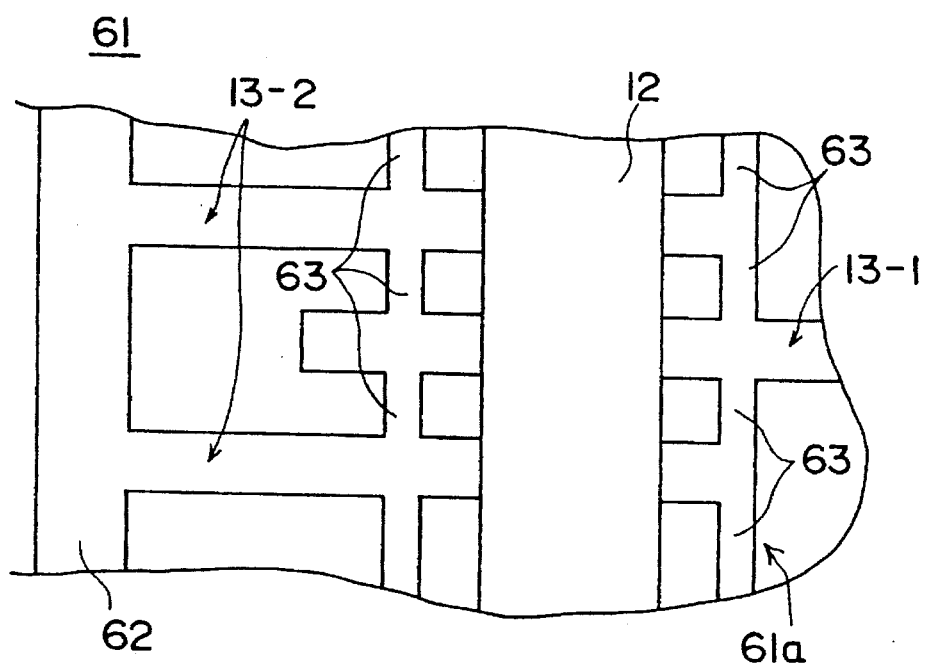
FIG. 31 is a plan view of a part of a variation of the lead frame shown in FIG. 30.

FIG. 31 shows a lead frame 61 which is a variation of the lead frame 60 shown in FIG. 30. In the lead frame 61, a connecting portion 62 is formed so as to connect each of the connecting leads 13-2 at a extreme ends thereof so that deformation of the connecting leads 13-2 is prevented. Accordingly, a yield rate and reliability of the mounting member 10 can be improved by using the lead frame 61.

In FIGS. 30 and 31, a portion indicated by reference numeral 63 is a tie bar which is provided for preventing a leakage of resin when the frame member 12 is formed by molding.

It should be noted that the mounting members 30 and 50 can be formed with a lead frame having a configuration similar to the lead frame 60 and 61.

The present invention is not limited to the specifically disclosed embodiments, and variations and modifications may be made without departing from the scope of the present invention.

What is claimed is:

1. A mounting construction of a semiconductor device having a plurality of outer leads extending from sides of a package thereof, the mounting construction comprising:

a mounting board having a surface on which a plurality of terminals to be electrically connected to said semiconductor device are provided; and a mounting member being mounted on said mounting board separately from said semiconductor device, said semiconductor device being attached to said mounting member, said mounting member comprising;

a frame member forming a space in which said semiconductor device is placed, said frame member having a bottom surface which faces said surface of said mounting board;

at least one first connecting lead provided to said frame member, said first connecting lead having a first lead connecting portion which makes a contact with a corresponding one of said outer leads of said semiconductor device placed in said space, said first connecting lead having a first external connecting portion to be connected to a corresponding one of said terminals provided on said mounting board, said first external connecting portion extending along said bottom surface of said frame member; and at least one second connecting lead provided to said frame member, said second connecting lead having a second lead connecting portion which makes a contact with a corresponding one of said outer leads of said semiconductor device placed in said space, said second connecting lead having a second external connecting portion to be connected to a corresponding one of said terminals provided on said mounting board, said second external connecting portion extending along said bottom surface of said frame member, said first external connecting portion extending from outside said frame member, and said second external connecting portion extending from said space formed by said frame member, said first external connecting portion and said second external connecting portion being arranged alternately with a predetermined distance apart from each other in a direction along an extending direction of said frame member.

2. The mounting construction as claimed in claim 1, wherein at least one of said outer leads of said semiconductor device and said first and second lead connecting portions are elastically deformed when said semiconductor device is placed in said space of said mounting member so that said semiconductor device is pressed into said space and is detachably attached to said mounting member.

3. The mounting construction as claimed in claim 1, wherein said package of said semiconductor device is made of a material different from a material of said frame member.

4. The mounting construction as claimed in claim 3, wherein said package being made of a plastic material having a softening point higher than said frame member.

5. The mounting construction as claimed in claim 3, wherein said frame member is made of a plastic material having moldability better than said package of said semiconductor device.

6. The mounting construction as claimed in claim 1, wherein said first external connecting portion and said second external connecting portion extend toward each other when viewing from side.

7. The mounting construction as claimed in claim 1, wherein said first external connecting portion and said second external connecting portion extend in opposite directions when viewing from side.

8. The mounting construction as claimed in claim 1, wherein said first external connecting portion and said second external connecting portion extend in the same direction.

9. The mounting construction as claimed in claim 1, wherein said first and second lead connecting portions are provided inside said space of said frame member so that said outer leads of said semiconductor device are connected to said first and second lead connecting portions inside said space of said frame member.

10. The mounting construction as claimed in claim 1, wherein said first and second lead connecting portions are provided outside said frame member so that said outer leads of said semiconductor device are connected to said first and second lead connecting portions outside said frame member.

11. The mounting construction as claimed in claim 1, wherein said first and second connecting leads are formed so that a portion of each of said first and second connecting leads is exposed on a top surface of said frame member, respective one of said first and second lead connecting portions being formed in said portion of each of said first and second connecting leads so that the corresponding one of said outer leads makes a contact with said first and second lead connecting portions on said top surface of said frame member.

12. The mounting construction as claimed in claim 11, wherein a fitting portion is formed on each of said first and second lead connecting portions so that an end of each of said outer leads is fitted in said fitting portion, respectively.

13. The mounting construction as claimed in claim 1, wherein said package of said semiconductor device comprising an upper half and a lower half with said connecting leads extending therebetween, said lower half being smaller than said upper half when viewing from bottom side so that a stage is formed on said package, said stage being placed on said frame member in a state in which said outer leads are in contact with said first and second lead connecting portions.

14. The mounting construction as claimed in claim 13, wherein at least one through hole is formed in each of said semiconductor device, said mounting member and said mounting board, said through hole aligning when said semiconductor device and said mounting member being mounted on said mounting board so that said semiconductor device and said mounting member are securely fastened to said mounting board by means of a pin inserted into and fixed in said through holes.

15. A lead frame for making a mounting member, said mounting member comprising:

a frame member forming a space in which a semiconductor device is placed, said frame member having a bottom surface which faces said surface of a mounting board;

at least one first connecting lead provided to said frame member, said first connecting lead having a first lead connecting portion which makes a contact with a corresponding one of outer leads of said semiconductor device placed in said space, said first connecting lead having a first external connecting portion to be connected to a corresponding one of a plurality of terminals provided on a mounting board, said first external connecting portion extending along said bottom surface of said frame member; and at least one second connecting lead provided to said frame member, said second connecting lead having a second lead connecting portion which makes a contact with a corresponding one of said outer leads of said semiconductor device placed in said space, said second connecting lead having a second external connecting portion to be connected to a corresponding one of said terminals provided on said mounting board, said second external connecting portion extending along said bottom surface of said frame member, said first external connecting portion extending from outside said frame member, and said second external connecting portion extending from said space formed by said frame member, said first external connecting portion and said second external connecting portion being arranged alternately with a predetermined distance apart from each other in a direction along an extending direction of said frame member, said lead frame comprising:

a lead frame body; and a plurality of extending portions extending from said lead frame body, said extending portions corresponding to portions of said first and second connecting leads extending from said frame member when said lead frame is formed to be said mounting member, a length of each of said extending portions corresponding to said first connecting leads is different from a length of each of said extending portions corresponding to said second connecting leads.

16. The lead frame as claimed in claim 15, wherein said extending portions corresponding to longer one of said first and second connecting leads are connected by a connecting portion at extreme ends thereof.

* * * * *